United States Patent
Di Stefano et al.

(10) Patent No.: US 7,870,800 B2
(45) Date of Patent: Jan. 18, 2011

(54) APPARATUS INCLUDING A FLUID COUPLER INTERFACED TO A TEST HEAD

(75) Inventors: Peter T. Di Stefano, San Jose, CA (US); Thomas H. Di Stefano, Monte Sereno, CA (US)

(73) Assignee: Centipede Systems, Inc., San Jose, CA (US)

( * ) Notice: Subject to any disclaimer, the term of this patent is extended or adjusted under 35 U.S.C. 154(b) by 1069 days.

(21) Appl. No.: 11/527,891

(22) Filed: Sep. 27, 2006

(65) Prior Publication Data

US 2007/0288823 A1    Dec. 13, 2007

Related U.S. Application Data

(60) Provisional application No. 60/800,829, filed on May 15, 2006.

(51) Int. Cl.
 *G01D 21/00* (2006.01)
(52) U.S. Cl. ................................... 73/866.5; 324/760
(58) Field of Classification Search ................ 73/866.5, 73/865.8; 324/760, 763, 765
See application file for complete search history.

(56) References Cited

U.S. PATENT DOCUMENTS

| 3,724,536 A | 4/1973 | Baxter | 165/256 |
|---|---|---|---|
| 4,381,032 A | 4/1983 | Cutchaw | 165/46 |

(Continued)

FOREIGN PATENT DOCUMENTS

WO    2004008053    1/2004

OTHER PUBLICATIONS

"Thermal Conduction Module Cooling" IBM Tech Disc. Bull. p. 531, Jul. 1983.

*Primary Examiner*—Hezron Williams
*Assistant Examiner*—Tamiko D Bellamy
(74) *Attorney, Agent, or Firm*—Michael B. Einschlag

(57) ABSTRACT

One embodiment of the present invention is an apparatus including a fluid coupler interfaced to a test head that includes: (a) a first ring having a top surface disposed in a first plane; (b) a first movable ring, the first movable ring being movable substantially normal to the first plane relative to the first ring; (c) a first flexible diaphragm attached to the first ring along a first attachment perimeter that encloses a first effective surface area, the first flexible diaphragm being attached to the first movable ring; (d) a second ring having a top surface disposed in a second plane; (e) a second movable ring, the second movable ring being movable substantially normal to the first plane; and (f) a second flexible diaphragm attached to the second ring along a second attachment perimeter that encloses a second effective surface area, the second flexible diaphragm being attached to the second movable ring; wherein: (i) the first flexible diaphragm and the second flexible diaphragm form a first channel for fluid flow, there being an intake aperture in the first channel and an exhaust aperture in the first channel; (ii) the test head has an intake channel to internal fluid channels and an exhaust channel from the internal fluid channels, and the test head is movable substantially normal to the first plane; (iii) the first plane is substantially parallel to the second plane; and (iv) the intake aperture in the test head is alignable with the exhaust aperture in the first channel.

33 Claims, 6 Drawing Sheets

U.S. PATENT DOCUMENTS

| | | | |
|---|---|---|---|
| 4,468,717 A | 8/1984 | Mathias et al. | 361/702 |
| 4,729,060 A | 3/1988 | Yamamoto et al. | 361/700 |
| 4,783,721 A | 11/1988 | Yamamoto et al. | 361/689 |
| 4,820,976 A | 4/1989 | Brown | 324/760 |
| 4,926,118 A * | 5/1990 | O'Connor et al. | 324/760 |
| 4,933,747 A | 6/1990 | Schroeder | 257/714 |
| 4,964,458 A | 10/1990 | Flint et al. | 165/80.4 |
| 5,164,661 A | 11/1992 | Jones | 324/760 |
| 6,373,133 B1 | 4/2002 | DiGiacomo et al. | 257/713 |
| 6,392,431 B1 | 5/2002 | Jones | 324/760 |
| 6,587,345 B2 | 7/2003 | Chu et al. | 361/719 |
| 6,975,028 B1 | 12/2005 | Wayburn et al. | 257/718 |
| 6,993,922 B2 | 2/2006 | Wall et al. | 62/223 |
| 7,017,358 B2 | 3/2006 | Wayburn et al. | 62/115 |
| 7,100,389 B1 * | 9/2006 | Wayburn et al. | 62/259.2 |
| 2002/0088113 A1 | 7/2002 | Hwang | 29/743 |
| 2005/0155219 A1 | 7/2005 | Hwang | 29/739 |

* cited by examiner

APPARATUS INCLUDING A FLUID COUPLER INTERFACED TO A TEST HEAD

CROSS-REFERENCES TO RELATED APPLICATIONS

This patent application is related to U.S. patent application entitled: "Mounting Apparatus," which application is commonly assigned with this application, is filed the same day as this application, and has the same inventors as this application.

This patent application relates to U.S. Provisional Application No. 60/800,829 filed May 15, 2006, from which priority is claimed under 35 USC §119(e), and which provisional application is incorporated herein in its entirety.

TECHNICAL FIELD OF THE INVENTION

One or more embodiments of the present invention relate to apparatus utilized in testing functionality and reliability of devices, and more specifically, to apparatus including a fluid coupler interfaced to a test head.

BACKGROUND OF THE INVENTION

During manufacture, electronic devices are tested to assess their functionality and reliability. Such tests often include testing the electronic devices at high power levels or at high temperatures. High temperature testing accelerates failure mechanisms that cause infant mortality or early failure of the electronic devices, and allows defective electronic devices to be screened out before they are used commercially.

Conventionally, high temperature tests are carried out using a test head having a temperature controlled surface that is thermally engaged with a top surface of a device under test ("DUT") that is installed in a test fixture—the DUT is installed in the test fixture so that its top surface is aligned to the test head. The test head is intended to maintain the DUT at a predetermined temperature during testing. However, in a manufacturing facility, after being installed in the test fixture, the top surface of the DUT may be misaligned with respect to the test head. Hence, the temperature controlled surface of the test head may not fully engage with the top surface of the DUT. As a result, thermal transfer between the test head and the DUT may not be optimum, leading to inefficient and improper testing.

To deal with such misalignment in certain testing systems, an assembly is provided that includes cylindrical flexible members for connecting a support structure and the test head. The flexible members, such as spring mountings, gimbaled mountings, and bellows mountings, enable the test head to compensate for misalignment and bring the test head in better contact with the DUT. However, the use of such flexible members adds complexity and expense to test heads, and may entail exerting excessive mechanical forces on test heads.

In testing high power electronic devices, in addition to heating, it is often necessary to cool the devices by thermal transfer to a cooling fluid flowing through the test head. Commonly used cooling fluids include water, glycol-water mixtures, fluorinated hydrocarbons, and various gases. Conventionally, the cooling fluid is supplied under pressure to the test head to force the fluid through the test head at a rate sufficient to cool the DUT. The cooling fluid is often conveyed to and from the test head using a conventional flexible fluid coupler such as a flexible tube or a flexible bellows—the flexible fluid coupler enables the test head to move so that it can be urged into contact with the top surface of the DUT.

However, the pressure of the cooling fluid within the conventional flexible fluid coupler produces unbalanced forces on the test head. For example, in a conventional flexible tube, flexible fluid coupler, fluid pressure in the tube causes it to straighten or bend, thereby putting an uncontrolled force on the test head. In a conventional flexible bellows, flexible fluid coupler, fluid pressure in the bellows causes it to expand and buckle in modes that can produce unwanted forces on the test head, thereby disturbing thermal contact of the test head to the DUT. As is well known, distortion of a flexible fluid coupler and unbalanced forces that the coupler transmits to the test head depend upon the exact shape of the flexible fluid coupler, the fluid pressure, and the flow rate of cooling fluid. Thus, uncontrolled and undesirable forces applied to a test head by conventional flexible fluid couplers is a problem that is increasing in importance in cooling high power electronic devices without causing excessive mechanical forces on the test head.

In light of the above, there is a need in the art for apparatus that solves one or more of the above-identified problems.

SUMMARY OF THE INVENTION

One or more embodiments of the present invention solve one or more of the above-identified problems. In particular, one embodiment of the present invention is an apparatus including a fluid coupler interfaced to a test head that comprises: (a) a first ring having a top surface disposed in a first plane; (b) a first movable ring, the first movable ring being movable substantially normal to the first plane relative to the first ring; (c) a first flexible diaphragm attached to the first ring along a first attachment perimeter that encloses a first effective surface area, the first flexible diaphragm being attached to the first movable ring; (d) a second ring having a top surface disposed in a second plane; (e) a second movable ring, the second movable ring being movable substantially normal to the first plane; and (f) a second flexible diaphragm attached to the second ring along a second attachment perimeter that encloses a second effective surface area, the second flexible diaphragm being attached to the second movable ring; wherein: (i) the first flexible diaphragm and the second flexible diaphragm form a first channel for fluid flow, there being an intake aperture in the first channel and an exhaust aperture in the first channel; (ii) the test head has an intake channel to internal fluid channels and an exhaust channel from the internal fluid channels, and the test head is movable substantially normal to the first plane; (iii) the first plane is substantially parallel to the second plane; and (iv) the intake aperture in the test head is alignable with the exhaust aperture in the first channel.

Another embodiment of the present invention is an apparatus including a fluid coupler interfaced to a test head from a fixed manifold that comprises: (a) a first flexible diaphragm attached along a first attachment perimeter to the fixed manifold and along a first manifold attachment perimeter to a second manifold; (b) a second flexible diaphragm attached along a second attachment perimeter to the fixed manifold and along a second manifold attachment perimeter to the second manifold, wherein the second flexible diaphragm is positioned above the first flexible diaphragm and the second manifold attachment perimeter lies substantially in a plane; and (c) a third flexible diaphragm attached along a third attachment perimeter to the fixed manifold and along a third manifold attachment perimeter to the second manifold, wherein the third flexible diaphragm is positioned between the first flexible diaphragm and the second flexible diaphragm; wherein: (i) the second manifold and the test head are movable in a direction that is substantially normal to the plane; (ii) the first flexible diaphragm and the second flexible diaphragm form a channel for fluid flow from the fixed manifold to the test head; and (iii) the second flexible diaphragm and the third flexible diaphragm form a channel for fluid flow from the test head to the fixed manifold.

Yet another embodiment of the present invention is an apparatus including a valve coupled to a test head that comprises: (a) the test head having internal fluid channels connecting an intake aperture with an exhaust aperture; (b) an outer manifold having an intake aperture and an exhaust aperture; and (c) an inner manifold having an intake aperture and an exhaust aperture, the outer manifold being mated to the inner manifold, and the inner manifold being rotatable about a longitudinal axis thereof; wherein: (i) the test head is mounted to the inner manifold so that: (x) the intake aperture in the test head is aligned with the intake aperture in the inner manifold and (y) the exhaust aperture in the test head is aligned with the exhaust aperture in the inner manifold; (ii) the inner manifold and the test head mounted thereto may be rotated to an open configuration in which: (x) the intake aperture in the inner manifold is aligned with the intake aperture in the outer manifold and (y) the exhaust aperture in the inner manifold is aligned with the exhaust aperture in the outer manifold; and (iii) the inner manifold and the test head mounted thereto may be rotated to a closed configuration in which: (x) the intake aperture in the inner manifold is not aligned with the intake aperture in the outer manifold and (y) the exhaust aperture in the inner manifold is not aligned with the exhaust aperture in the outer manifold.

DETAILED DESCRIPTION

Figure 1A:
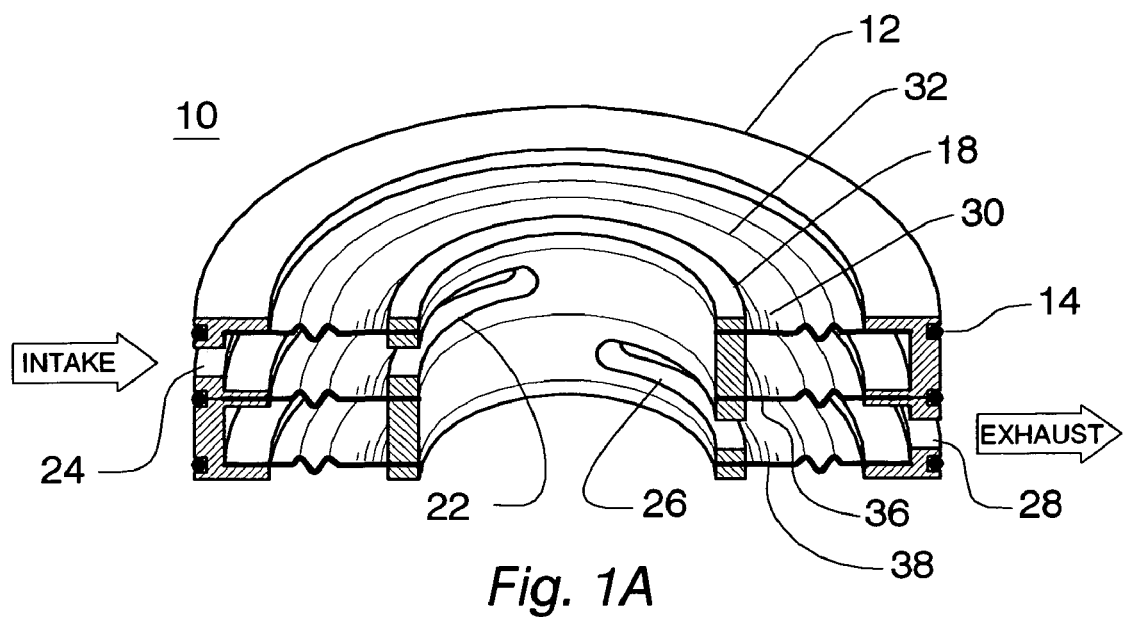
FIG. 1A is a cross sectional view, shown in perspective, of a fluid coupler that is fabricated in accordance with one or more embodiments of the present invention where the fluid coupler is shown in an initial condition before deflection.

FIG. 1A is a cross sectional view, shown in perspective, of fluid coupler 10 that is fabricated in accordance with one or more embodiments of the present invention, where fluid coupler 10 is shown in an initial condition before deflection. As shown in FIG. 1A, movable ring 18 is attached to fixed ring 12 by flexible diaphragms 30, 36, and 38.

As can be readily appreciated from FIG. 1A, and in accordance with one or more embodiments of the present invention, flexible diaphragms 30 and 36 form a first channel (an "intake channel") that contains intake fluid, for example and without limitation, a cooling fluid, that: (a) enters the intake channel through aperture 24 in fixed ring 12; and (b) exits the intake channel through aperture 22 in movable ring 18. Hydrostatic pressure in the intake fluid exerts an upward hydraulic force on flexible diaphragm 30 and a downward hydraulic force on flexible diaphragm 36.

As used herein, an attachment perimeter is a boundary line that delineates a line of attachment between a flexible diaphragm and fixed ring 12—at an inner perimeter of fixed ring 12. In accordance with one or more embodiments of the present invention, the attachment perimeter for a flexible diaphragm may be, for example and without limitation, circular, oval, oblong, square, rectangular, or any other shape, including irregularly shaped.

In accordance with one or more embodiments of the present invention: (a) an attachment perimeter of flexible diaphragm 30 encloses a first surface area in the intake channel; and (b) an attachment perimeter of flexible diaphragm 36 encloses a second surface area in the intake channel. As used herein, surface area is an effective surface area, for example, an effective surface area is a surface area projected onto a plane (for example and without limitation, a plane normal to a vertical direction). For most purposes, for substantially planar surface areas, the surface area is substantially equal to the effective surface area. As such, the term surface area will be used below with the understanding that the term effective surface area may have to be utilized to fabricate certain embodiments of the present invention.

In accordance with one or more embodiments of the present invention, the first surface area is equal or substantially equal to the second surface area, and as a result, the upward hydraulic force exerted (by the intake fluid) on movable ring 18 is substantially balanced by the downward hydraulic force exerted (by the intake fluid) on movable ring 18. As one can readily appreciate from this, for embodiments wherein the upward and downward hydraulic forces are in balance, a change in hydrostatic pressure in the intake fluid does not exert a substantial net force on movable ring 18. Preferably the net force on movable ring 18 is less than 20% of a total vertical force applied to movable ring 18.

As can be readily appreciated from FIG. 1A, and in accordance with one or more embodiments of the present invention, flexible diaphragms 36 and 38 form a second channel (an "exhaust channel") that contains the exhaust fluid, for example and without limitation, a cooling fluid, that: (a) enters the exhaust channel through aperture 26 in movable ring 18; and (b) exits the exhaust channel through aperture 28 in fixed ring 12. As one can readily appreciate from this, exhaust fluid is separated from intake fluid by flexible diaphragm 36. Hydrostatic pressure in the exhaust fluid exerts an upward hydraulic force on flexible diaphragm 36 and a downward hydraulic force on flexible diaphragm 38. In accordance with one or more embodiments of the present invention: (a) an attachment perimeter of flexible diaphragm 36 encloses a first surface area in the exhaust channel; and (b) an attachment perimeter of flexible diaphragm 38 encloses a second surface area in the exhaust channel. In accordance with one or more embodiments of the present invention, the first surface area is equal or substantially equal to the second surface area, and as a result, the upward hydraulic force exerted (by the exhaust fluid) on movable ring 18 is substantially balanced by the downward hydraulic force exerted (by the exhaust fluid) on movable ring 18. As one can readily appreciate from this, for embodiments wherein the upward and downward hydraulic forces are in balance, a change in hydrostatic pressure in the exhaust fluid does not exert a substantial net force on movable ring 18.

In accordance with one or more embodiments of the present invention, flexible diaphragms 30, 36, and 38 are each fabricated from resilient materials that enable movable ring 18 (attached thereto) to move vertically (i.e., in a direction approximately normal to a plane through a top surface of fixed ring 12). In accordance with one or more embodiments of the present invention, the flexible diaphragms are made of a thin sheet of about 0.002 inch thick, 304 stainless steel that is embossed with two concentric grooves, for example, concentric grooves 32 shown in diaphragm 30 of FIG. 1A. However, in accordance with one or more further embodiments of the present invention, the flexible diaphragms may be made from monel, nickel alloys, waspalloy, rubber, organic films, polyimide, superplastic metals, or other resilient materials. In addition, and in accordance with one or more further embodiments of the present invention, the flexible diaphragms may be made from thin foils of metal such as, for example and without limitation, beryllium-copper alloy, brass, bronze, stainless steel, titanium, titanium alloy, nickel alloy, nitinol, or other alloys of high yield strength. In addition, and in accordance with one or more further embodiments of the present invention, the flexible diaphragms may be made from thin sheets of elastic material such as, for example and without limitation, polyimide, polyamide, silicone, rubber, polyurethane, urethane, or polymer materials that exhibit low creep. In further addition, and in accordance with one or more further embodiments of the present invention, the flexibility of the diaphragms may be enhanced by use of one or more concentric grooves, one or more spiral grooves, one or more radial grooves, one or more thin multilayer sheets, one or more selectively thinned sections, one or more embossed grooves, a combination of any of the foregoing, or structures fabricated in accordance with any one of a number of other techniques that are well known to those of ordinary skill in the art. Further, in accordance with one or more embodiments of the present invention, rings 12 and 18 are made of 304 stainless steel; although any relatively rigid material may be used. Still further, in accordance with one or more embodiments of the present invention, flexible diaphragms 30, 36, and 38 are attached to fixed ring 12 and to movable ring 18 by, for example and without limitation, a cu-sil braze alloy.

In accordance with one or more embodiments of the present invention, and as shown in FIG. 1A, flexible diaphragms 30, 36, and 38 of fluid coupler 10 are circularly symmetrical and identical. However, it is within the scope of the present invention that further embodiments exist wherein diaphragms of various other shapes and proportions can be used to fabricate fluid couplers in accordance with the present invention. Further, in accordance with one or more such embodiments, it should be understood that the term ring is not meant to limit embodiments of the present invention to configurations wherein a ring refers to a structure having a generally circular shape. In fact, it is within the scope of the present invention that further embodiments exist wherein rings 12 and 18 refer to structures having a peripheral portion with an empty area within the peripheral portion and wherein the peripheral portion may be, for example and without limitation, circular, oblong, square, rectangular, or otherwise irregularly shaped. Further, in accordance with one or more embodiments of the present invention, the flexible diaphragms that bound the flow of fluid through the fluid coupler may be of dissimilar shape and size. Still further, in accordance with one or more such embodiments, top and bottom diaphragms forming channels that bound the flow of fluid through the fluid coupler may have first and second attachment areas that may be substantially equal or may be different, depending upon particular design objectives.

In accordance with one or more embodiments of the present invention, and as shown in FIG. 1A, in fluid coupler 10, intake aperture 24 is disposed diametrically opposite to exhaust aperture 28 to minimize thermal contact between intake cooling fluid and exhaust cooling fluid by means of interposed diaphragm 36. However, it should be understood that this is not meant to limit embodiments of the present invention to configurations where intake aperture 24 is disposed diametrically opposite to exhaust aperture 28. In fact, it is within the scope of the present invention that further embodiments exist wherein intake aperture 24 and exhaust aperture 28 are disposed differently from the configuration shown in FIG. 1A. In addition, in accordance with one or more further embodiments of the present invention, thermal contact between intake cooling fluid and exhaust cooling fluid can be reduced by disposing baffles, porous materials, intermediate rings, grooves, or other structures in the path of the cooling fluid within one or more of the channels to direct its flow from intake aperture 24 to exhaust aperture 28.

As is shown in FIG. 1A, and as was described above, fluid coupler 10 enables intake cooling fluid to flow: (a) out of the intake channel; (b) through aperture 22 in movable ring 18; and (c) through aperture 26 in movable ring 18 into the exhaust channel. Further, in accordance with one or more further embodiments of the present invention, and as was described above, movable ring 18 is able to move vertically (i.e., in a direction approximately normal to a plane through a top surface of fixed ring 12). In accordance with one or more such further embodiments of the present invention, the ability to cause movable ring 18 to move vertically, enables movable ring 18 to urge a test head mounted thereto into contact with a device under test ("DUT"). As one can readily appreciate from the above, even if the hydrostatic pressure of the intake cooling fluid and the hydrostatic pressure of the exhaust cooling fluid were different, as is typically the case, advantageously, in accordance with one or more embodiments of the present invention, the difference in hydrostatic pressures would not cause a substantially unbalanced force to be applied to a test head mounted to movable ring 18.

Figure 1B:
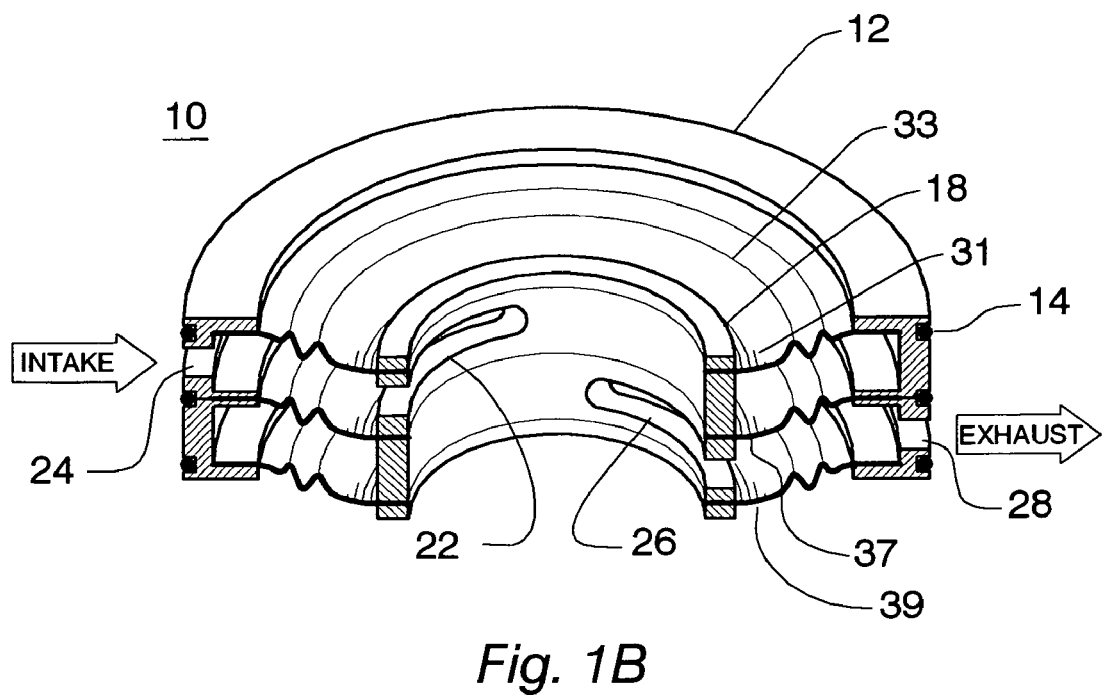
FIG. 1B is a cross sectional view, shown in perspective, of the fluid coupler shown in FIG. 1A after deflection.

FIG. 1B is a cross sectional view, shown in perspective, of fluid coupler 10 where movable ring 18 has moved downward in a direction approximately normal to a plane through a top surface of fixed ring 12. Whenever movable ring 18 is caused to move downward, in accordance with one or more embodiments of the present invention, and as shown in FIG. 1B, flexible diaphragms 30, 36, and 38 are distended into diaphragm shapes 31, 37, and 39, respectively. Advantageously, in accordance with one or more such embodiments, concentric grooves 32 in flexible diaphragm 30 (of FIG. 1A) provide additional compliancy thereto, thereby enabling flexible diaphragm 30 to stretch radially (into diaphragm shape 31 with concentric groove shapes 33 of FIG. 1B) as movable ring 18 is moved downwardly. Further, in accordance with one or more such embodiments, (a) intake fluid is able to flow unimpeded from intake aperture 24 in fixed ring 12 to aperture 22 in movable ring 18; and (b) exhaust cooling fluid is able to flow unimpeded from aperture 26 in movable ring 18 to exhaust aperture 28 in fixed ring 12.

In accordance with one or more embodiments of the present invention, fluid coupler 10 may be adapted for use in a support manifold. As such, as shown in FIG. 1A, and in accordance with one or more embodiments of the present invention, O-ring seals 14 are disposed on a cylindrical surface of fluid coupler 10 to seal it to the support manifold, and thereby, contain intake cooling fluid and exhaust cooling fluid. In accordance with one or more such embodiments, O-ring seals 14 are fabricated from any one of a number of materials that are well known to those of ordinary skill in the art such as, for example and without limitation, polytetrafluoroethylene (PTFE), that are suited for sealing against leakage of cooling fluids such as, for example and without limitation, water, ethanol-water mixtures, ethylene glycol-water mixtures, Fluorinert®, Galden®, helium, compressed air, nitrogen, hydrogen-helium mixtures, and other commonly known cooling fluids.

Figure 2A:
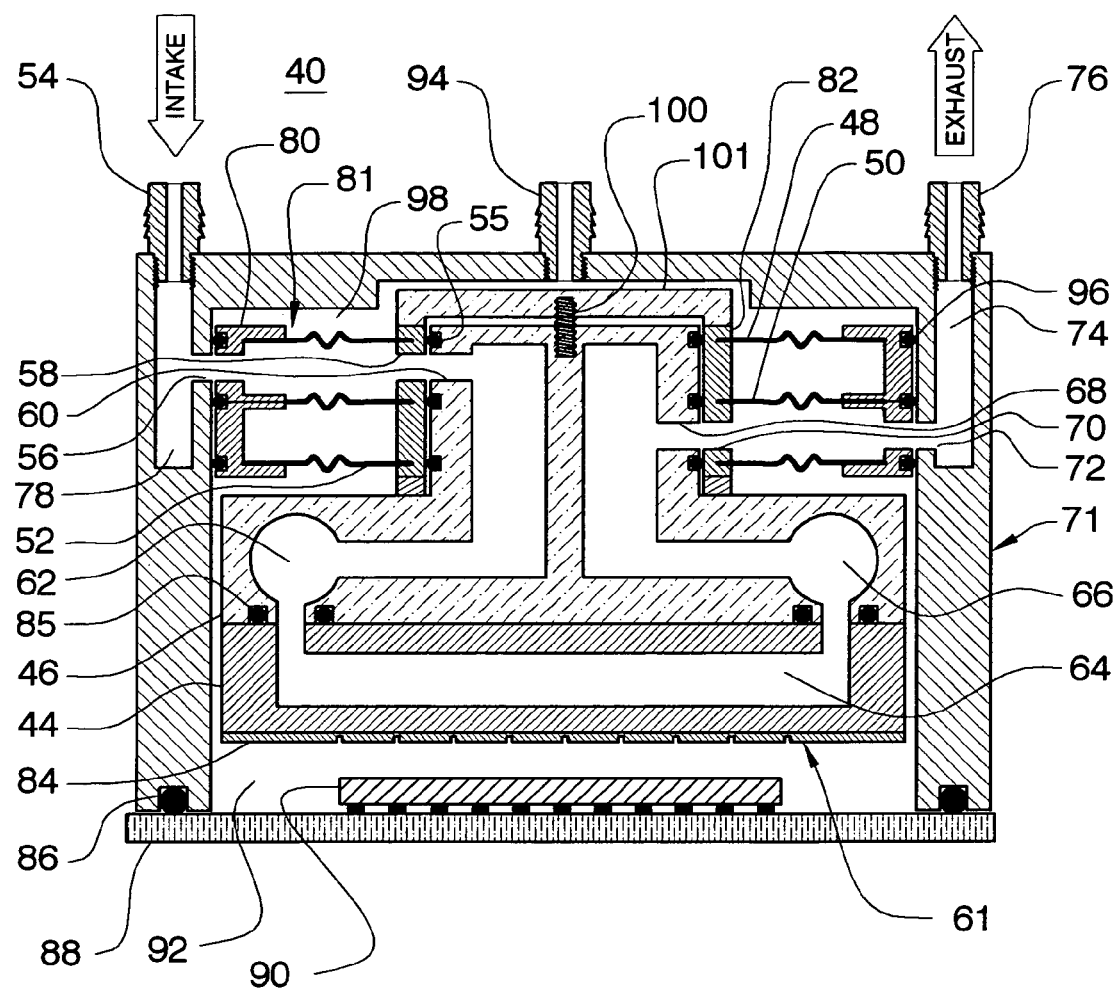
FIG. 2A is a cross sectional view of a thermal test assembly that is fabricated in accordance with one or more embodiments of the present invention where the thermal test assembly is shown before actuation to test an electronic device under test.

FIG. 2A is a cross sectional view of thermal test assembly 40 that is fabricated in accordance with one or more embodiments of the present invention where thermal test assembly 40 is shown before actuation to test electronic device under test 90 ("DUT 90"). As shown in FIG. 2A, fluid coupler 81 that is incorporated into thermal test assembly 40 is fabricated in accordance with one or more embodiments of the present invention such as, for example and without limitation, fluid coupler 10 described above. However, in this embodiment, the movable ring of fluid coupler 10 is formed from portions of movable manifold wall 82.

As further shown in FIG. 2A, support manifold 71 holds fluid coupler 81, which, in turn, holds detachable test head 61. As further shown in FIG. 2A, the intake aperture and exhaust aperture of fluid coupler 81 are sealed to apertures 56 and 72 in support manifold 71, respectively, by O-rings 96. In accordance with one or more embodiments of the present invention, thermal test assembly 40 is adapted to cool DUT 90 by flowing cooling fluid to cool cold plate 44 (cold plate 44 forms a part of test head 61), and urging cold plate 44 downward so that thermal interface material 84 (for example and without limitation, a material such as eGRAF HiTherm from GrafTech International Ltd. of Cleveland, Ohio) contacts DUT 90—FIG. 2A shows test head 61 in a retracted position wherein thermal interface material 84 is not in contact with DUT 90. As further shown in FIG. 2A, O-ring 86 seals support manifold 71 to wiring substrate 88 to: (a) form chamber 92; and (b) enable chamber 92 to be filled with a controlled ambient such as, for example and without limitation, helium, dry nitrogen, dry air, vacuum, or any gas or mixture of gasses needed to facilitate testing of DUT 90.

Figure 2B:
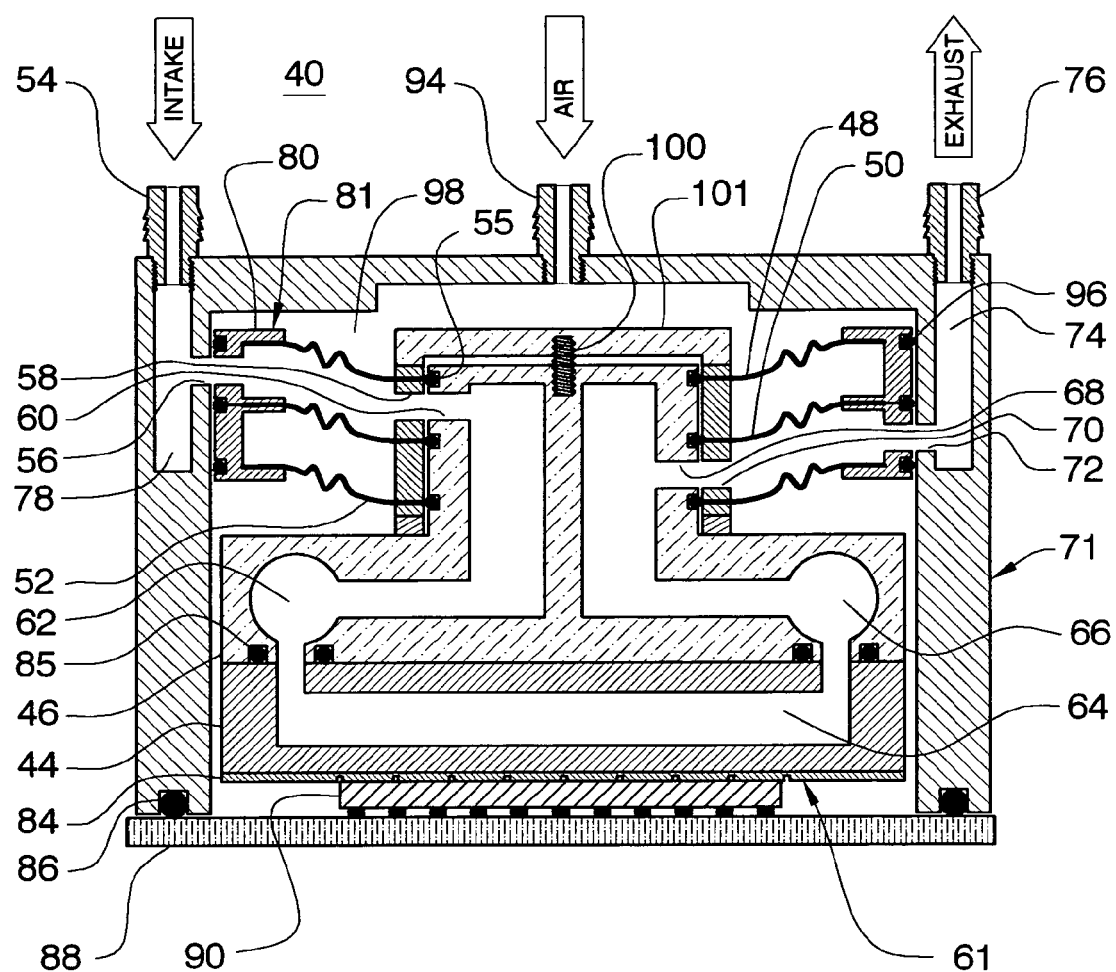
FIG. 2B is a cross sectional view of the thermal test assembly shown in FIG. 2A after actuation to test an electronic device under test.

FIG. 2B is a cross sectional view of thermal test assembly 40 shown in FIG. 2A after actuation to test DUT 90. To operate thermal test assembly 40 for testing with reference to FIG. 2B, first, support manifold 71 is urged downward into contact with wiring substrate 88 using any one of a number of mechanisms (not shown for sake of understanding the present invention) that are well known to those of ordinary skill in the art. Next, detachable test head 61 (mounted to attachment plate 101) is urged into contact with DUT 90 by injecting compressed air into inlet 94, thereby pressurizing chamber 98 and forcing detachable test head 61 and movable manifold wall 82 downward by pneumatic pressure against flexible diaphragm 48 and attachment plate 101. In accordance with one or more embodiments of the present invention, pressure applied to DUT 90 can be controlled by adjusting the pressure of the compressed air. As shown in FIG. 2B, downward motion of movable manifold wall 82 distends each of flexible diaphragms 48, 50, and 52 attached thereto.

Next, cooling fluid is introduced through inlet 54 into channel 78 in support manifold 71. As one can appreciate from FIG. 2B, the cooling fluid flows: (a) out of channel 78 through aperture 56 therein; (b) through an intake aperture in fixed ring 80 of fluid coupler 81; (c) into an intake channel between flexible diaphragms 48 and 50 of fluid coupler 81; and (d) out of the intake channel through aperture 58 in movable manifold wall 82 of fluid coupler 81. As one can further appreciate from FIG. 2B, the cooling fluid then flows: (a) through intake aperture 60 in detachable test head 61; (b) into intake plenum 62 in manifold 46 of detachable test head 61; and (c) into channel 64 in cold plate 44 (cold plate 44 is in thermal contact with thermal interface material 84). O-ring seals 85 prevent leakage of cooling fluid from a junction between cold plate 44 and manifold 46. As further shown in FIG. 2B, exhaust cooling fluid leaving cold plate 44 flows: (a) into exhaust plenum 66 in manifold 46 of detachable test head 61; (b) through exhaust aperture 68 of detachable test head 61; (c) through aperture 70 in movable manifold wall 82 of fluid coupler 81; (d) into an exhaust channel between flexible diaphragms 50 and 52 in fluid coupler 81; and (e) out of fluid coupler 81 through an exhaust aperture in fixed ring 80 of fluid coupler 81. Next, exhaust cooling fluid flows: (a) through aperture 72 in support manifold 71; (b) into channel 74 in support manifold 71; and (c) out through outlet 76 of support manifold 71.

In light of the above, and in accordance with one or more embodiments of the present invention, intake cooling fluid, at an intake pressure, is conducted from inlet 54, through a set of passages, to cold plate 44. Then, exhaust cooling fluid is conducted from cold plate 44, through a set of passages, to exhaust outlet 76 where it leaves at an exhaust pressure. In accordance with one or more embodiments of the present invention, the hydrostatic pressure of the cooling fluid exerts no significant net force on the thermal head. Accordingly, changes in intake pressure and/or exhaust pressure exert no substantial net force on thermal test head 61 of thermal test assembly 40. Advantageously, cooling fluids can be introduced into the thermal test head without disturbing significantly any sensitive measurements made thereby due to transients in pressure in the cooling fluid. In accordance with one or more such embodiments, attachment perimeters of flexible diaphragms 48, 50, and 52 enclose equal surface areas However, as was described above, in accordance with one or more alternative embodiments of the present invention, the attachment perimeters of the flexible diaphragms may also enclose unequal surface areas, and exhibit unbalanced hydrostatic forces with respect to a vertical direction, i.e., a direction normal to a plane of cold plate 44.

In accordance with one or more embodiments of the present invention, flexible diaphragms 48, 50, and 52 maintain the alignment of cold plate 44 with respect to DUT 90 during vertical motion. Advantageously, in accordance with one or more embodiments of the present invention, resiliency of flexible diaphragms 48, 50, and 52 enables a slight gimbal motion of cold plate 44, thereby accommodating non-planarity of a surface of DUT test 90.

In operation of thermal test assembly 40, detachable test head 61 may be retracted from DUT 90 by "pulling a vacuum" on inlet 94, thereby evacuating chamber 98 and causing an upward force on flexible diaphragm 48 and attachment plate 101. The upward force retracts cold plate 44 and attached thermal interface material 84 away from DUT 90 as may be required to overcome any adhesive force between DUT 90 and thermal interface material 84. In accordance with one or more alternative embodiments of the present invention, upward and downward motion of detachable test head 61 may be controlled by use of any one of a number of methods that are well known to those of ordinary skill in the art for embodying force actuators including, for example and without limitation, a hydraulic piston, an electrical solenoid, a magnetic force actuator, a direct screw gear drive, a linear motor, a piezoelectric actuator, a vacuum, and other force actuators.

In accordance with one or more embodiments of the present invention, detachable test head 61, including cold plate 44, thermal interface material 84, and manifold 46, can be removed from thermal test assembly 40 for repairs or replacement. To do this: (a) thermal test assembly 40 is lifted up and off wiring substrate 88 (and hence, DUT 90); (b) next, detachable test head 61 is rotated with respect to threaded fastening device 100 to detach it therefrom; and (c) next, detachable test head 61 is pulled downward and out of support manifold 71. In accordance with one or more such embodiments, a replacement for detachable test head 61 is mounted to thermal test assembly 40 by: (a) inserting it upwardly into support manifold 71 and into movable manifold wall 82 of fluid coupler 81; and (b) next, rotating detachable test head 61 to engage threaded fastening device 100 and to tighten detachable test head 61 to attachment plate 101. Further, when being rotated for insertion, detachable test head 61 is aligned so that apertures 60 and 68 therein are sealed to apertures 58 and 70 of fluid coupler 81, respectively, by means of O-ring seals 55. Although thermal test assembly 40 uses threaded fastening device 100 to mount detachable test head 61, further embodiments of the present invention exist wherein any one of a number of fastening mechanisms that are well known to those of ordinary skill in the art may be used to provide a fastening device. For example, and without limitation, such fastening mechanisms include: a threaded screw, an electromagnetic catch; a magnetic catch; a spring latch; a cam lock; a rotational cam, a bayonet latch; an adhesive material; a solder material; a phase change thermoplastic adhesive; and other fastening mechanisms that are well known to those of ordinary skill in the art.

As one can readily appreciate from the above, thermal test assembly 40 shown in FIG. 2A is an embodiment of the present invention that may be used to supply a flow of fluid to a test head, for example, a detachable test head (refer to detachable test head 61 in FIG. 2A), while allowing the test head to move a fixed distance along a fixed path (refer to the vertical movement described in conjunction with FIGS. 2A and 2B). The flow of fluid to the test head is used to control the temperature of an electronic device under test (refer to DUT 90 in FIG. 2A). Movement of the test head along a path toward the device under test allows a surface of the test head (refer to thermal interface material 84 in FIG. 2A) to be urged against a juxtaposed surface of the device with a controlled force. Advantageously, in accordance with this embodiment of the present invention, a controlled force of the test head on the device under test is provided while the controlled force is not substantially disturbed by forces caused by pressure differences in the cooling fluid as it flows through the test head. Further, in accordance with this embodiment, a difference in fluid pressure between fluid entering the test head and fluid leaving the test head does not substantially change the force exerted by the test head on the electronic device under test.

As one can readily appreciate from the above, fluid coupler 81 shown in FIG. 2A is an embodiment of the present invention that provides fluid coupling to a test head (refer to detachable test head 61 in FIG. 2A) of a thermal test assembly (refer to thermal test assembly 40 in FIG. 2A), while enabling the test head to move a small amount in a direction toward a device under test (refer to DUT 90 in FIG. 2A) without disturbing fluid flow. In accordance with one or more such embodiments of the thermal test assembly, intake fluid is directed: (a) from a fixed manifold (refer to channel 78 in FIG. 2A); (b) to an intake channel between two flexible diaphragms (refer to flexible diaphragms 48 and 50 in FIG. 2A); (c) to a movable manifold (refer to manifold 46 in FIG. 2A) fluidly connected to the intake channel; and (d) through a thermal plate (refer to cold plate 44 in FIG. 2A) that may be temporarily or permanently affixed to the movable manifold. In addition, exhaust fluid is directed: (a) out of the test head; (b) through the movable manifold; (c) to an exhaust channel between two flexible diaphragms (refer to flexible diaphragms 50 and 52 in FIG. 2A) that is fluidly connected to the movable manifold; and (d) to a fixed manifold (refer to channel 74 in FIG. 2A). In accordance with one or more embodiments of the present invention, a flexible diaphragm may be shared by the intake channel and the exhaust channel, i.e., one of the two flexible diaphragms forming an intake channel for intake fluid may be the same diaphragm as one of the two diaphragms forming an exhaust channel for exhaust fluid. Further, in accordance with one or more embodiments of the present invention, the test head may be moved in a direction substantially perpendicular to a plane of the thermal plate by exerting a force on the test head and the movable manifold, whereby the diaphragms attached to the movable manifold are flexed and distorted. In accordance with one or more such embodiments, the diaphragm areas and shapes are chosen to reduce forces due to hydrostatic pressure of the cooling fluid, whereby pressure in fluid flowing to the test head and pressure in fluid flowing from the test head do not exert a substantial unbalanced force on the test head. Further, in accordance with one or more such embodiments, the test head is able to tilt by flexure and distortion of the flexible diaphragms attached to the movable ring supporting the test head, thereby providing a small amount of gimbal motion which enables the test head to accommodate slightly tilted samples.

Figure 3A:
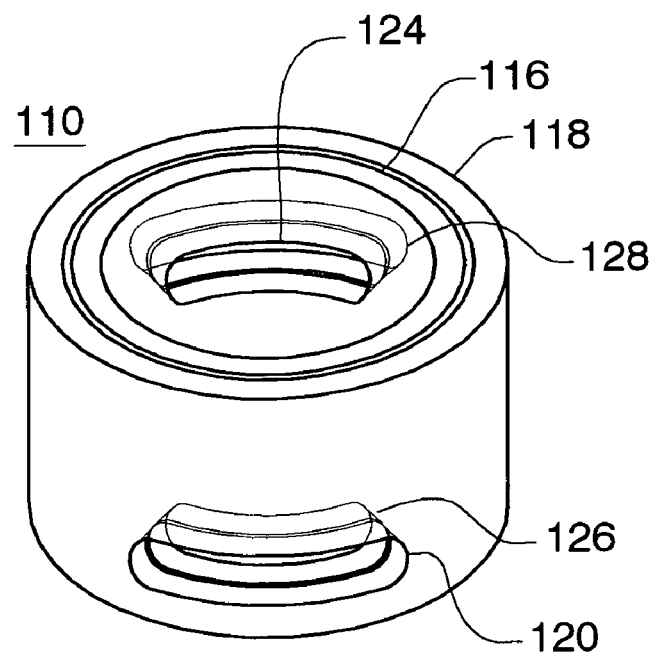
FIG. 3A is a perspective view of a valve that is fabricated in accordance with one or more embodiments of the present invention, which valve is adapted to mount a thermal test head to a fluid coupler, where fluid channels in the valve are disposed in an open configuration.

FIG. 3A is a perspective view of valve 110 that is fabricated in accordance with one or more embodiments of the present invention. Valve 110 is adapted to fluidly connect a thermal test head to a fluid coupler. In accordance with one or more embodiments of the present invention, the fluid coupler described above may incorporate valve 110.

As shown in FIG. 3A, valve 110 includes outer manifold 118 that is mated, for example and without limitation, by a slip fit to inner, cylindrical manifold 116. In accordance with one or more embodiments of the present invention, cylindrical manifold 116 is rotatable about its longitudinal axis. As further shown in FIG. 3A: (a) manifold 118 includes intake aperture 120 and exhaust aperture 128; and (b) cylindrical manifold 116 includes intake aperture 126 and exhaust aperture 124. As further shown in FIG. 3A, apertures 126 and 124 in cylindrical manifold 116 correspond to apertures 120 and 128, respectively, in manifold 118.

FIG. 3A shows valve 110 disposed in an "open" configuration wherein intake aperture 120 in manifold 118 is aligned with intake aperture 126 in cylindrical manifold 116, thereby enabling fluid, for example, intake cooling fluid, to flow therethrough. Similarly, exhaust aperture 128 in manifold 118 is aligned with exhaust aperture 124 in cylindrical manifold 116, thereby enabling fluid, for example, exhaust cooling fluid, to flow therethrough. In use in accordance with one or more embodiments of the present invention, in the "open" configuration of valve 110, cooling fluid is able to flow to and from a thermal test head mounted to cylindrical manifold 116.

Figure 3B:
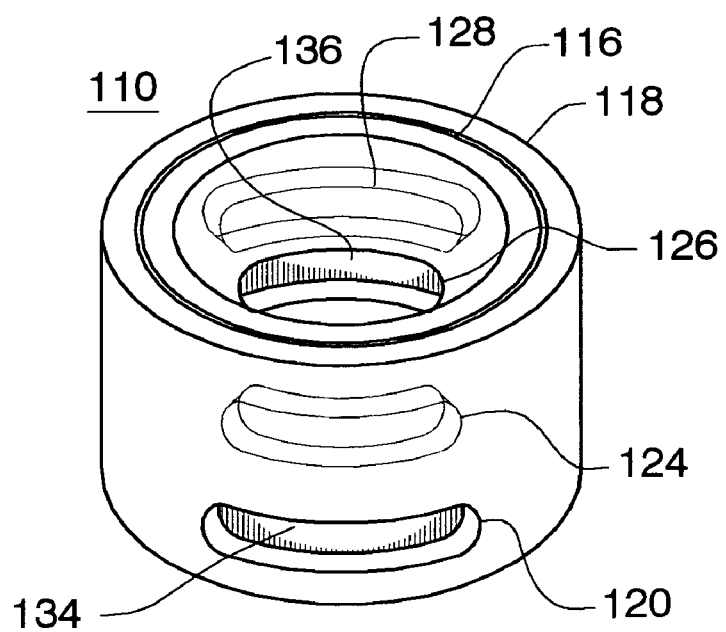
FIG. 3B is a perspective view of the valve shown in FIG. 3A where the fluid channels in the valve are disposed in a closed configuration.

FIG. 3B is a perspective view of valve 110 shown in FIG. 3A disposed in a "closed" configuration wherein cylindrical manifold 116 is rotated about its longitudinal axis by a predetermined angle, for example, 180°, from its position when valve 110 is disposed in the "open" configuration. As shown in FIG. 3B, in the "closed" configuration, intake aperture 120 in manifold 118 is blocked by wall 134 of cylindrical manifold 116. In addition, in the "closed" configuration, exhaust aperture 126 in cylindrical manifold 116 is blocked by wall 136 of manifold 118. As a result, in use in accordance with one or more embodiments of the present invention, in the "closed" configuration of valve 110, cooling fluid is blocked from entering into or exiting from a thermal test head mounted to cylindrical manifold 116.

As one can readily appreciate from the above, valve 110 may be used to interface a fluid coupler to a test head having internal fluid channels connecting an intake aperture in the test head with an exhaust aperture in the test head. In such a configuration, the valve would include: (a) an outer manifold having an intake aperture and an exhaust aperture; (b) an inner manifold having an intake aperture and an exhaust aperture; where the outer manifold is mated to the inner manifold, and the inner manifold is rotatable about a longitudinal axis thereof. The detachable test head is mounted to the inner manifold so that: (a) the intake aperture in the test head is aligned with the intake aperture in the inner manifold and (b) the exhaust aperture in the test head is aligned with the exhaust aperture in the inner manifold. Then, in accordance with one or more embodiments of the present invention, (a) the inner manifold and the test head mounted thereto may be rotated to an open configuration in which: (i) the intake aperture in the inner manifold is aligned with the intake aperture in the outer manifold and (ii) the exhaust aperture in the inner manifold is aligned with the exhaust aperture in the outer manifold; and (b) the inner manifold and the test head mounted thereto may be rotated to a closed configuration in which: (i) the intake aperture in the inner manifold is not aligned with the intake aperture in the outer manifold and (ii) the exhaust aperture in the inner manifold is not aligned with the exhaust aperture in the outer manifold.

Figure 4A:
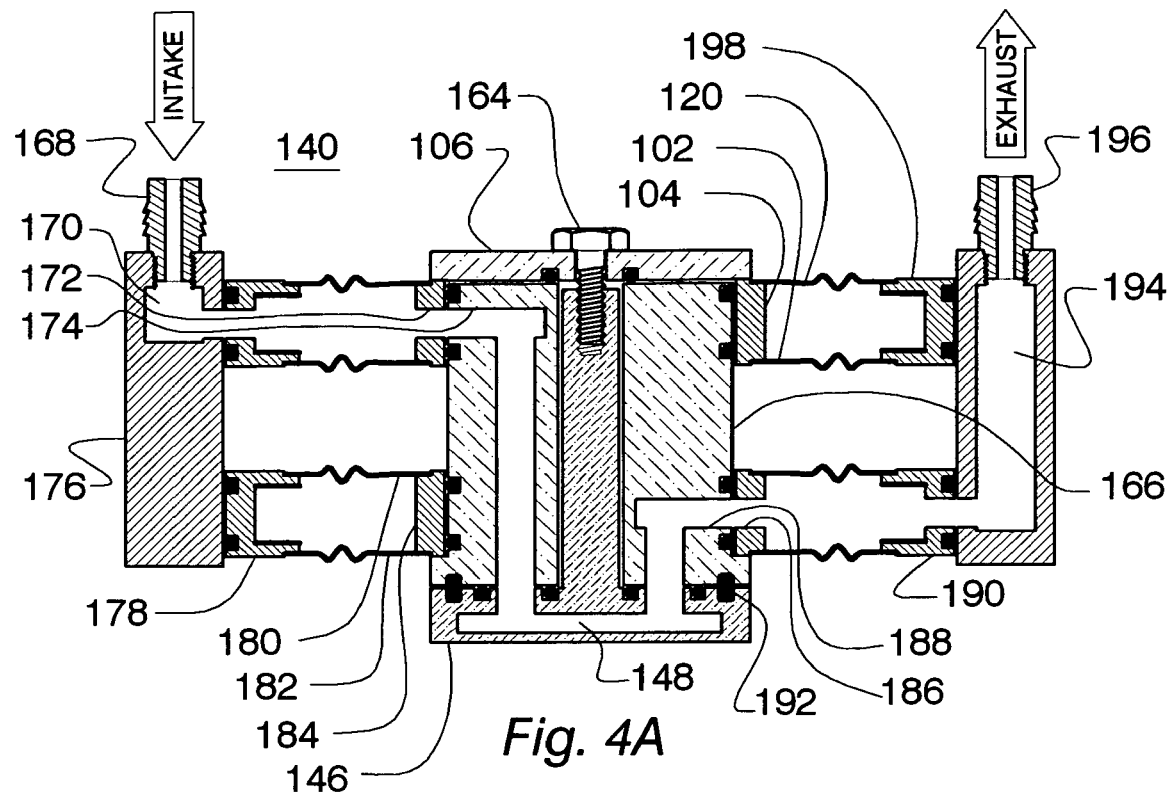
FIG. 4A is a cross sectional view of a thermal test assembly that is fabricated in accordance with one or more further embodiments of the present invention.

FIG. 4A is a cross sectional view of thermal test assembly 140 that is fabricated in accordance with one or more further embodiments of the present invention. As will be described below, thermal test assembly 140 is adapted to cool detachable test head 142 which is also shown separately in FIG. 4B.

Figure 4B:
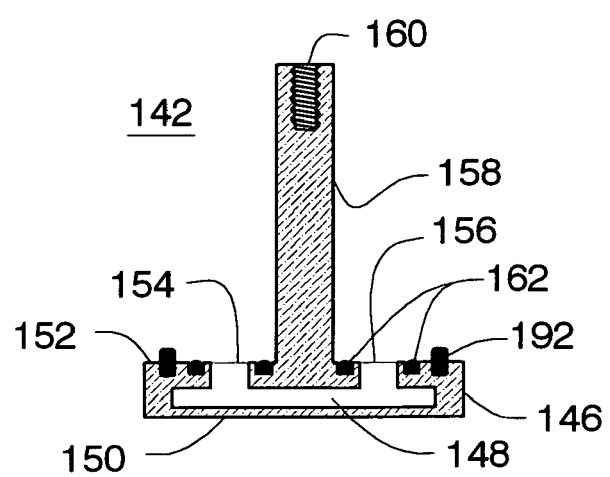
FIG. 4B is a cross sectional view of a detachable test head that is fabricated in accordance with one or more embodiments of the present invention, which detachable test head in included in the thermal test assembly shown in FIG. 4A.

As one can appreciate from FIGS. 4A and 4B, cold plate 146 of detachable test head 142 is cooled by a flow of cooling fluid from intake aperture 154, through passage 148, and out of exhaust aperture 156. As shown in FIGS. 4A and 4B, detachable test head 142 includes: (a) bottom surface 150 which is adapted to make contact with a top surface of a device under test; (b) a top surface which is adapted to attach detachable test head 142 to cylindrical manifold 166 by means of attachment plate 106 and fastening device 164 (for example and without limitation, a threaded fastener); (c) O-rings 162 which are adapted to seal apertures 154 and 156 to a face of cylindrical manifold 166; and (d) fastening receptacle 160 (for example and without limitation, a threaded hole) disposed at a distal end of mounting post 158. As one can appreciate from FIGS. 4A and 4B, the distal end of mounting post 158 is adapted to attach detachable test head 142 to cylindrical manifold 166 by means of attachment plate 106 and fastening device 164. In accordance with one or more embodiments of the present invention, cold plate 146 and mounting post 158 of detachable test head 142 are made of copper alloy 110, and O-rings 162 are made of polytetrafluoroethylene (PTFE).

In operation of thermal test assembly 140, cooling fluid is introduced through intake inlet 168 into chamber 170 in support manifold 176. As one can appreciate from FIG. 4A, the cooling fluid flows: (a) out of chamber 170 and through an aperture in first fixed ring 198; (b) into an intake channel between flexible diaphragms 102 and 120 attached to first fixed ring 198; (c) out of the intake channel through aperture 172 in first movable ring 104; and (d) into passage 174 in cylindrical manifold 166. As one can further appreciate from FIG. 4A, the cooling fluid then flows into intake aperture 154, through chamber 148 in cold plate 146, and out of exhaust aperture 156; all of detachable test head 142. O-ring seals 162 prevent leakage of cooling fluid from a junction between cold plate 146 and cylindrical manifold 166. As one can further appreciate from FIG. 4A, the exhaust cooling fluid leaving cold plate 146 flows: (a) through passage 188 in cylindrical manifold 166; (b) through aperture 186 in second movable ring 184; (c) through an exhaust channel formed between flexible diaphragms 180 and 182 attached to second fixed ring 190; and (d) out of the exhaust channel through an aperture in second fixed ring 190. Next, exhaust cooling fluid flows: (a) through an aperture in support manifold 176; (b) into chamber 194 in support manifold 176; and (c) out through outlet 196 in support manifold 176.

In accordance with one or more embodiments of the present invention, detachable test head 142 can be removed from thermal test assembly 140 by rotating detachable test head 142 counterclockwise to release fasting device 164 which holds mounting post 158 to attachment plate 106. As shown in FIGS. 4A and 4B, in accordance with one or more embodiments of the present invention, detachable test head 142 includes alignment pins 192 which can be positioned to be inserted into corresponding channels in cylindrical manifold 166. Then, in accordance with one or more such embodiments, when detachable test head 140 is attached to attachment plate 106, the alignment pins have been inserted into corresponding channels in cylindrical manifold 166. As a result, the process of rotating detachable test head 142 also causes cylindrical manifold 166 to rotate because of the engagement of alignment pins 192 with cylindrical manifold 166.

In accordance with one or more embodiments of the present invention, cylindrical manifold 166 is configured so that, when it is disposed at an "open" position, passage 174 and passage 188 are aligned with aperture 172 (in first movable ring 104) and aperture 186 (in second movable ring 184), respectively. Then, in accordance with one or more such embodiments, rotation of cylindrical manifold 166 to a "closed" position (for example, and without limitation, rotation by an angle of about 180° from the "open" position) causes: (a) aperture 172 in first movable ring 104 not to align with passage 174 in cylindrical manifold 166, thereby blocking flow of intake cooling fluid; and (b) aperture 186 in second movable ring 184 not to align with passage 188 in cylindrical manifold 166, thereby blocking flow of exhaust cooling fluid.

Figure 5:
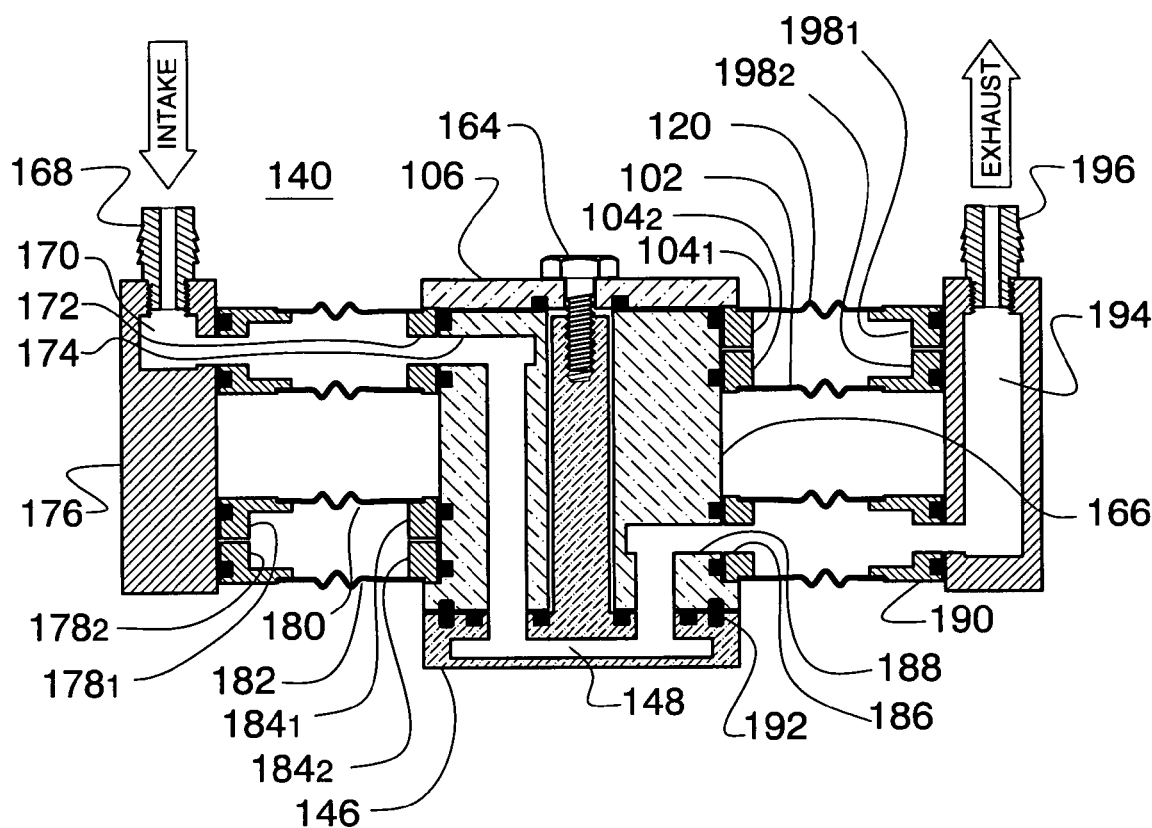
FIG. 5 is a cross sectional view of an embodiment of the thermal test assembly shown in FIG. 4A wherein each of the fixed and movable rings comprises two rings.

As one can readily appreciate from this, in accordance with one or more further embodiments of the present invention, movable rings 104 and 184 may comprise portions of a wall of a manifold. Then, in accordance with one or more such embodiments, the wall of the manifold would form the outer manifold of valve 110 shown in FIGS. 3A and 3B, and cylindrical manifold 166 would form the inner, rotatable manifold of valve 110 shown in FIGS. 3A and 3B. In addition, although thermal test assembly 140 shown in FIG. 4A comprises first and second fixed rings 198 and 190 and first and second movable rings 104 and 184, it can be readily appreciated by one of ordinary skill in the art, that each of these rings may be split into, or be considered as being comprised of, two rings (refer to FIG. 5 wherein: (a) first and second fixed rings 198 and 190 (also referenced by number 178) shown in FIG. 4A are split so that first, second, third and fourth fixed rings are rings $198_1$, $198_2$, $178_1$ and $178_2$, respectively; and (b) first and second movable rings 104 and 184 shown in FIG. 4A are split so that first, second, third and fourth movable rings are rings $104_1$, $104_2$, $184_1$ and $184_2$, respectively).

In accordance with one or more embodiments of the present invention, after rotating detachable test head 142 through a predetermined angle that is sufficient to detach fasting device 164 from mounting post 158, detachable test head 142 may be removed from thermal test assembly 140 by withdrawing it downwardly. When this is done, and cylindrical manifold 166 is at the "closed" position, cooling fluid does not leak out of thermal test assembly 140 when detachable test head 142 is removed because apertures 172 and 186 are blocked. Detachable test head 142 may be reattached by reversing the removal process.

Although thermal test assembly 140 uses threaded fastening device 164 to mount detachable test head 142, further embodiments of the present invention exist wherein any one of a number of fastening mechanisms that are well known to those of ordinary skill in the art may be used to provide a fastening device. For example, and without limitation, such fastening mechanisms include: a threaded screw, an electromagnetic catch; a magnetic catch; a spring latch; a cam lock; a rotational cam, a bayonet latch; an adhesive material; a solder material; a phase change thermoplastic adhesive; and other fastening mechanisms that are well known to those of ordinary skill in the art.

As one can readily appreciate from the above, thermal test assembly 140 shown in FIG. 4A is an embodiment of the present invention wherein a detachable test head (refer to detachable test head 142 in FIG. 4A) is fluidly connected to movable rings (refer to first and second movable rings 104 and 184, respectively, in FIG. 4A) to convey fluid into and out of the test head. In particular, the first movable ring is mounted to a movable manifold (refer to cylindrical manifold 166 in FIG. 4A), wherein the movable manifold (a) has an intake aperture (for receiving fluid from an aperture in the first movable ring), and (b) an intake channel that is connected to the detachable test head. In addition, the movable manifold (a) has an exhaust channel that is connected to the detachable test head, and (b) an exhaust aperture (for directing fluid through an aperture in the second movable ring). Further, as one can readily appreciate from the above, and in accordance with one or more embodiments of the present invention, in operation, the detachable test head is attached to the movable manifold so that the movable manifold is in the open position wherein fluid is able to flow through the first movable ring, through the intake aperture in the movable manifold, into the intake plenum in the movable manifold, and to the test head. Similarly, in the open position, the exhaust aperture in the movable manifold is aligned to enable fluid to flow through the second movable ring.

As one can readily appreciate from the above, the detachable test head may be taken out of operation and removed from the movable manifold by first moving the movable manifold into a closed position. This movement is accomplished by a rotation of the movable manifold, by a linear motion of the movable manifold, for example, by sliding along the cylindrical axis of the movable ring, by a helical screw motion of the moveable manifold with respect to the movable ring, or by some combination of motions. Appropriate movement of the movable manifold causes the intake aperture in the movable manifold not to be aligned with an aperture in the first movable ring, thereby closing a path for fluid flow to the test head. Correspondingly, the appropriate movement of the movable manifold causes the exhaust aperture in the movable manifold to no longer be aligned with an aperture in the second movable ring, thereby closing a path for fluid flow from the test head. The test head is then free to be removed from the thermal test assembly.

The embodiments of the present invention described above are exemplary. Many changes and modifications may be made to the disclosure recited above while remaining within the scope of the invention. For example, although embodiments were described that utilized rings, such as fixed rings and movable rings, it should be understood by those of ordinary skill in the art that the term rings may also be considered, for example and without limitation, to refer to appropriate portions of walls of manifolds. Further, when embodiments were described where flexible diaphragms were attached to rings, it should be understood by those of ordinary skill in the art that the term attached includes sealing to prevent fluid leakage.

In addition, materials, methods, and mechanisms suitable for fabricating embodiments of the present invention have been described above by providing specific, non-limiting examples and/or by relying on the knowledge of one of ordinary skill in the art. Materials, methods, and mechanisms suitable for fabricating various embodiments or portions of various embodiments of the present invention described above have not been repeated, for sake of brevity, wherever it should be well understood by those of ordinary skill in the art that the various embodiments or portions of the various embodiments could be fabricated utilizing the same or similar previously described materials, methods or mechanisms. Although above-described embodiments have related to cooling of microelectronic devices, such devices may be heated if the circulating fluid were heated. In such a case, the above-described embodiments could be used to transfer heat to microelectronic devices.

Further, although the term fluid coupler has been utilized above, it should be understood that this term is to be understood in the broadest sense to include, for example and without limitation, a fluid coupling apparatus. Still further, although embodiments of the present invention were described wherein an inner ring is movable and an outer ring is fixed, it should be understood by one of ordinary skill in the art that further embodiments of the present invention exist wherein the outer ring is movable and the inner ring is fixed or wherein an inner ring and an outer ring are movable relative to each other—in addition, in light of the description above, it will be clear to one of ordinary skill in the art how to fabricate such further embodiments routinely and without undue experimentation. The scope of the invention should therefore be determined not with reference to the above description, but instead should be determined with reference to the appended claims along with their full scope of equivalents.

What is claimed is:

1. Apparatus including a fluid coupler interfaced to a test head that comprises:
   a first ring having a top surface disposed in a first plane;
   a first movable ring, the first movable ring being movable substantially normal to the first plane relative to the first ring;
   a first flexible diaphragm attached to the first ring along a first attachment perimeter that encloses a first effective surface area, the first flexible diaphragm being attached to the first movable ring;
   a second ring having a top surface disposed in a second plane;

a second movable ring, the second movable ring being movable substantially normal to the first plane; and a second flexible diaphragm attached to the second ring along a second attachment perimeter that encloses a second effective surface area, the second flexible diaphragm being attached to the second movable ring;

wherein:

the first flexible diaphragm and the second flexible diaphragm form a first channel for fluid flow, there being an intake aperture in the first channel and an exhaust aperture in the first channel;

the test head has an intake channel to internal fluid channels and an exhaust channel from the internal fluid channels, and the test head is movable substantially normal to the first plane;

the first plane is substantially parallel to the second plane; and the intake aperture in the test head is alignable with the exhaust aperture in the first channel.

2. The apparatus of claim 1 wherein the intake aperture in the first channel is disposed between the first and second rings.

3. The apparatus of claim 1 wherein the exhaust aperture in the first channel is disposed between the first and second movable rings.

4. The apparatus of claim 1 wherein the test head is mounted to the first and second movable rings so that the intake aperture in the test head is aligned with the exhaust aperture in the first channel when the first and second movable rings move.

5. The apparatus of claim 1 wherein the first ring and the second ring comprise one piece of material.

6. The apparatus of claim 1 wherein the first movable ring and the second movable ring comprise one piece of material.

7. The apparatus of claim 1 wherein the first and second movable rings are disposed inside the first and second rings, respectively.

8. The apparatus of claim 1 wherein the first effective surface area is substantially equal to the second effective surface area.

9. The apparatus of claim 1 that further comprises:

a third ring having a top surface disposed in a third plane;

a third movable ring, the third movable ring being movable substantially normal to the first plane;

a third flexible diaphragm attached to the third ring along a third attachment perimeter that encloses a third effective surface area, the third flexible diaphragm being attached to the third movable ring;

a fourth ring having a top surface disposed in a fourth plane;

a fourth movable ring, the fourth movable ring being movable substantially normal to the first plane;

a fourth flexible diaphragm attached to the fourth ring along a fourth attachment perimeter that encloses a fourth effective surface area, the fourth flexible diaphragm being attached to the fourth movable ring;

wherein:

the third flexible diaphragm and the fourth flexible diaphragm form a second channel for fluid flow separated from the first channel, there being an intake aperture in the second channel and an exhaust aperture in the second channel disposed between the third and fourth movable rings;

the third and fourth planes are substantially parallel to the first plane; and the exhaust aperture in the test head can be aligned with the intake aperture in the second channel.

10. The apparatus of claim 9 wherein the intake aperture in the second channel is disposed between the third and fourth rings.

11. The apparatus of claim 9 wherein the exhaust aperture in the second channel is disposed between the third and fourth movable rings.

12. The apparatus of claim 9 wherein the test head is mounted to the first and second movable rings so that the exhaust aperture in the test head is aligned with the intake aperture in the second channel when the third and fourth movable rings move.

13. The apparatus of claim 9 wherein third ring and the fourth ring comprise one piece of material.

14. The apparatus of claim 9 wherein third movable ring and the fourth movable ring comprise one piece of material.

15. The apparatus of claim 9 wherein the third and fourth movable rings are disposed inside the third and fourth rings, respectively.

16. The apparatus of claim 9 wherein the third effective surface area is substantially equal to the fourth effective surface area 17. The apparatus of claim 1 wherein one or more of the first flexible diaphragm and the second flexible diaphragm is a thin foil of metal embossed with concentric grooves.

18. The apparatus of claim 1 wherein one or more of the first flexible diaphragm and the second flexible diaphragm is a thin foil of metal embossed with spiral grooves.

19. The apparatus of claim 1 wherein one or more of the first flexible diaphragm and the second flexible diaphragm is a thin sheet of elastic material comprised of one or more of polyimide, polyamide, silicone, rubber, polyurethane, urethane, and polymer materials that exhibit low creep.

20. Apparatus including a fluid coupler interfaced to a test head from a fixed manifold that comprises:

a first flexible diaphragm attached along a first attachment perimeter to the fixed manifold and along a first manifold attachment perimeter to a second manifold;

a second flexible diaphragm attached along a second attachment perimeter to the fixed manifold and along a second manifold attachment perimeter to the second manifold, wherein the second flexible diaphragm is positioned above the first flexible diaphragm and the second manifold attachment perimeter lies substantially in a plane; and a third flexible diaphragm attached along a third attachment perimeter to the fixed manifold and along a third manifold attachment perimeter to the second manifold, wherein the third flexible diaphragm is positioned between the first flexible diaphragm and the second flexible diaphragm;

wherein:

the second manifold and the test head are movable in a direction that is substantially normal to the plane;

the first flexible diaphragm and the second flexible diaphragm form a channel for fluid flow from the fixed manifold to the test head; and the second flexible diaphragm and the third flexible diaphragm form a channel for fluid flow from the test head to the fixed manifold.

21. The apparatus of claim 20 wherein an area enclosed by the first attachment perimeter and projected onto the plane, an area enclosed by the third attachment perimeter and projected onto the plane, and an area enclosed by the second attachment perimeter and projected onto the plane are all substantially equal.

22. The apparatus of claim 20 wherein the test head is a thermal head adapted to urge a cold plate onto a sample by action of the vertical motion.

23. The apparatus of claim 20 wherein one or more of the first, second, and third flexible diaphragms is a thin sheet of metal with a grooved surface.

24. The apparatus of claim 23 wherein the grooved surface includes concentric grooves embossed into the grooved surface.

25. The apparatus of claim 23 wherein the grooved surface includes spiral grooves embossed into the grooved surface.

26. The apparatus of claim 20 wherein one or more of the first, second flexible, and third diaphragms is a thin sheet of elastic material comprised of one or more of polyimide, polyamide, silicone, rubber, polyurethane, urethane, and polymer materials that exhibit low creep.

27. The apparatus of claim 20 further comprising a fluid intake for conducting a fluid under pressure against a top surface of the second diaphragm to drive the second diaphragm and the second ring away from the fluid intake.

28. Apparatus including a valve coupled to a test head that comprises:
the test head having internal fluid channels connecting an intake aperture with an exhaust aperture;
an outer manifold having an intake aperture and an exhaust aperture;
an inner manifold having an intake aperture and an exhaust aperture, the outer manifold being mated to the inner manifold, and the inner manifold being rotatable about a longitudinal axis thereof;
wherein:
the test head is mounted to the inner manifold so that: (a) the intake aperture in the test head is aligned with the intake aperture in the inner manifold and (b) the exhaust aperture in the test head is aligned with the exhaust aperture in the inner manifold;
the inner manifold and the test head mounted thereto may be rotated to an open configuration in which: (a) the intake aperture in the inner manifold is aligned with the intake aperture in the outer manifold and (b) the exhaust aperture in the inner manifold is aligned with the exhaust aperture in the outer manifold; and
the inner manifold and the test head mounted thereto may be rotated to a closed configuration in which: (a) the intake aperture in the inner manifold is not aligned with the intake aperture in the outer manifold and (b) the exhaust aperture in the inner manifold is not aligned with the exhaust aperture in the outer manifold.

29. The apparatus of claim 28 wherein the test head is detachably mounted to the inner manifold.

30. The apparatus of claim 28 wherein the test head has a flat thermal transfer surface perpendicular to the axis.

31. The apparatus of claim 29 wherein the test head is rotatably detachably mounted to the inner manifold.

32. Apparatus including a valve coupled to a detachable test head that comprises:
the test head having internal fluid channels connecting an intake aperture with an exhaust aperture;
an outer manifold having an intake aperture and an exhaust aperture;
an inner manifold adapted to receive the detachable test head, the inner manifold having an intake aperture and an exhaust aperture, the outer manifold being mated to the inner manifold, the inner manifold having a first internal channel for flow of fluid from the intake aperture of the inner manifold to the intake aperture of the test head and having a second internal channel for flow of fluids from the exhaust aperture of the test head to the exhaust aperture of the inner manifold; and
wherein:
the test head is mounted to the inner manifold so that: (a) the intake aperture in the test head is aligned with the intake aperture in the inner manifold and (b) the exhaust aperture in the test head is aligned with the exhaust aperture in the inner manifold;
the inner manifold is rotatable relative to the outer manifold about an axis;
the inner manifold and the test head mounted thereto are movable to an open configuration in which: (a) the intake aperture in the inner manifold is aligned with the intake aperture in the outer manifold and (b) the exhaust aperture in the inner manifold is aligned with the exhaust aperture in the outer manifold; and
the inner manifold and the test head mounted thereto are movable to a closed configuration in which: (a) the intake aperture in the inner manifold is not aligned with the intake aperture in the outer manifold and (a) the exhaust aperture in the inner manifold is not aligned with the exhaust aperture in the outer manifold.

33. The valve coupled to a detachable test head of claim 32 wherein:
the inner manifold and the test head mounted thereto are movable to an open configuration comprises are rotatable; and
the inner manifold and the test head mounted thereto are movable to a closed configuration comprises are rotatable by a predetermined angle.

* * * * *